US010002664B2

(12) United States Patent
Vianello et al.

(10) Patent No.: US 10,002,664 B2
(45) Date of Patent: Jun. 19, 2018

(54) NON-VOLATILE RESISTIVE MEMORY CELL COMPRISING METAL ELECTRODES AND A SOLID ELECTROLYTE BETWEEN THE METAL ELECTRODES

(71) Applicant: COMMISSARIAT A L'ENERGIE ATOMIQUE ET AUX ENE ALT, Paris (FR)

(72) Inventors: Elisa Vianello, Grenoble (FR); Gabriel Molas, Grenoble (FR); Giorgio Palma, Grenoble (FR); Olivier Thomas, Revel (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days. days.

(21) Appl. No.: 14/489,789

(22) Filed: Sep. 18, 2014

(65) Prior Publication Data
US 2015/0078065 A1 Mar. 19, 2015

(30) Foreign Application Priority Data
Sep. 18, 2013 (FR) ...................... 13 58989

(51) Int. Cl.
*G11C 13/00* (2006.01)
*H01L 45/00* (2006.01)

(52) U.S. Cl.
CPC ...... *G11C 13/0069* (2013.01); *G11C 13/0011* (2013.01); *H01L 45/085* (2013.01);
(Continued)

(58) Field of Classification Search
CPC ................ G11C 13/0069; G11C 13/0011
See application file for complete search history.

(56) References Cited

U.S. PATENT DOCUMENTS

2011/0317472 A1* 12/2011 Awaya .............. G11C 11/16
365/148
2012/0147656 A1* 6/2012 Sone .................. H01L 45/085
365/148
(Continued)

FOREIGN PATENT DOCUMENTS

WO WO 2007/141865 A1 12/2007

OTHER PUBLICATIONS

Palma et al., A novel HfO2—GeS2—Ag based Conductive Bridge RAM for reconfigurable logic applications, 2013, IEEE.*
(Continued)

*Primary Examiner* — Alexander Sofocleous
*Assistant Examiner* — Alfredo Bermudez Lozada
(74) *Attorney, Agent, or Firm* — Oblon, McClelland, Maier & Neustadt, L.L.P.

(57) ABSTRACT

The invention more particularly relates to a resistive memory cell comprising a first and a second metal electrodes and a solid electrolyte positioned between the first and the second metal electrodes, with the solid electrolyte comprising a commutation layer in contact with the first electrode and a dielectric layer, with said resistive memory cell being able to be electrically modified so as to switch from a first resistive state to a second resistive state (state LRS) wherein the resistance ($R_{ON}$) of the memory cell is at least ten times smaller than the resistance ($R_{OFF}$) of the memory cell in the HRS state, in the LRS state the first electrode being so arranged as to supply metal ions intended to form at least a conductive filament through said commutation layer, with the cell being characterized in that, in the LRS state, the memory cell is conductive for a range of voltages between 0 Volts and
(Continued)

$$\frac{VREST}{2}.$$

17 Claims, 4 Drawing Sheets

(52) U.S. Cl.
CPC .......... *H01L 45/12* (2013.01); *H01L 45/1233* (2013.01); *H01L 45/1266* (2013.01); *H01L 45/142* (2013.01); *G11C 2013/0073* (2013.01); *G11C 2013/0083* (2013.01); *G11C 2213/32* (2013.01); *G11C 2213/51* (2013.01); *G11C 2213/54* (2013.01)

(56) References Cited

U.S. PATENT DOCUMENTS

2012/0168705 A1* 7/2012 Liu .................... G11C 13/0002 257/4
2014/0264223 A1* 9/2014 Tendulkar ............. H01L 45/147 257/2

OTHER PUBLICATIONS

Palma et al., Interface Engineering of Ag—GeS2-Based Conductive Bridge RAM for Reconfigurable Logic Applications, Mar. 2014, IEEE Transactions on Electron Devices.*

Palma et al., A novel HfO2—GeS2—Ag based Conductive Bridge RAM for reconfigurable logic application, 2013, IEEE.*

Jameson et al., Quantized Conductance in Ag/GeS2/W Conductive-Bridge Memory Cells, Feb. 2012, IEEE Electron Device Letters.*

Schindler et al., Bipolar and Unipolar Resistive Switching in Cu-Doped SiO2, Oct. 2007, IEEE Transaction on Electron Devices, vol. 54 pp. 2762-2768.*

French Preliminary Search Report dated Jun. 24, 2014 in French Application 13 58989, filed on Sep. 18, 2013 ( with English translation of Categories of Cited Documents and Written opinion).

G. Palma et al. "A novel $HFO_2$—$GeS_2$_Ag based on Conductive Bridge RAM for reconfigurable logic applications", 978-1-4799-0649-9/13. 2013, 2 pages.

Jaeyun Yi et al. "Research on Switching property of an oxide/copper sulfide hybrid memory", Non-Volatile Memory Technology Symposium, 2008, 4 pages.

Giorgio Palma et al. "Interface Engineering of Ag—$GeS_2$-Based Conductive Bridge RAM for Reconfigurable Logic Applications" IEEE Transactions on Electron Devices, vol. 61, No. 3, Mar. 2014, 8 pages.

S. Z. Rahaman et al. "Improved Resistive Switching Memory Characteristics Using Novel Bi-Layered $Ge_{0.2}Se_{0.8}/Ta_2O_5$ Solid-Electrolytes", 978-1-4244-6721-1, 2010, 4 pages.

Yu-Yu Lin et al. A Novel TiTe Buffered Cu—$GeSbTe/SiO_2$ Electrochemical Resistive Memory (ReRAM), 2010 Symposium of VLSI Technology Digest of Technical paper, 2010, 2 pages.

Prakash Periasamy et al. "Metal-Insulator-Metal Diodes: Role of the Insulator Layer on the Rectification Performance", Advanced Materials, 2013, 8 pages.

* cited by examiner

Prior Art

NON-VOLATILE RESISTIVE MEMORY CELL COMPRISING METAL ELECTRODES AND A SOLID ELECTROLYTE BETWEEN THE METAL ELECTRODES

TECHNICAL FIELD OF THE INVENTION

The present invention generally relates to the random access electronic memories or RAM, and more particularly those wherein storage is obtained by a reversible change in the resistance (R) of their internal structure, and which are then called RRAM or ReRAM.

STATE OF THE ART

At present, attempts are made to remedy, or at least very significantly reduce the existing performances and capacities discrepancies between, on the one hand, the volatile memories of the dynamic RAM type (DRAM) characterised by a very quick random access to any one of the stored data, and which are mainly used for the production of computer random access memories, and on the other hand, the non volatile memories having a very high capacity of the magnetic hard disk type or still the so-called FLASH electronic memories which also are non volatile and have a great capacity with, however, shorter access times than the DRAM, or even much slower times for the hard disks, and an at least partially sequential access to the data stored in both cases.

The new electronic memories are also expected to be easily integrated in the logic components of the integrated circuit (CI) type using these. For example, an application requiring to be able to combine a large number of logic circuits and of independent electronic memories is more particularly a so-called «FPGA» circuit, the acronym for «field programmable gate array» which refers to a widely used type of logic circuit consisting in an array of logic functions (gate array) the logic functions of which can be programmed and the interconnections thereof after production (field programmable) from the information stored in a large number of individual memories positioned on the whole surface of the FPGA circuit.

A type of electronic memory attempting to totally meet these expectations, i.e.: high storage capacity, random access to the data, short access-to-data time, non volatility, compatibility of production with the logic circuits more particularly with those of the CMOS (complementary metal-oxide-semiconductor) type, low consumption, has been developed for a few years and are particularly interesting for the research and development teams working in this field. These are random access resistive memories globally called by their acronym ReRAM or RRAM. They are also often referred to by other acronyms more particularly referring to their operating mode, such as the CBRAM or «conductive bridge RAM» wherein «conductive bridges» can be created or removed in each one of the memory cells so that their resistance and thus the information stored therein can be permanently, i.e. in a non volatile way, but reversibly, modified. This type of memory cell is also known as PMC and EMC, the respective acronyms for «programmable metallization cell» and «electrochemical metallization cell», which refers to the production mode of the conductive bridges in a solid electrolyte sandwiched between metal electrodes.

One of the advantages of the CBRAMs is their facility of integration in the circuits and the CMOS technology. As a matter of fact, the production of CBRAM memory cell can be very advantageously realized upon completion of the steps of production of the complementary MOS transistors, i.e. during the final steps executed on an integrated circuits production line, the so-called «BEOL», the acronym for «back-end of line», final steps during which the metal interconnections between transistors are executed at much lower temperatures than for the initial forming of the MOS transistors.

In the field of the resistive RAM of the CBRAM type, many innovations have already been provided by the research and development teams working on this subject.

For example, in an article presented in June 2010 at the «VLSI Technology (VLSIT) Symposium» entitled «A novel TiTe buffered Cu—GeSbTe/SiO2 electrochemical resistive memory (ReRAM)» the authors describe a structure of the resistive RAM type which adds a «buffer layer», in this case made of titanium/tellurium (TiTe). The buffer layer separates the layer intended to supply the copper ions which are used to provide a «conductive bridge» (CB) through a normally non conductive layer called here a memory layer and which is made of silicon dioxide (SiO2) in this case. The materials and the thicknesses of the layers are so selected as to enhance the reliability of the device disclosed and the authors say that they indeed noted a much higher thermal stability of the conductive bridge thus formed because of the presence of the buffer layer which prevents the diffusion and the dissolution of the copper ions after forming the conductive bridge. It should be noted here that the layer called the memory layer in this article is also often called a commutation layer or «switching layer» in other publications.

In another publication entitled «Improved resistive switching memory characteristics using novel bi-layered Ge0.2Se0.8/Ta2O5 solid-electrolytes» presented in May 2010 at the «IEEE International Memory Workshop (IMW)» the authors describe a device of the CBRAM type, the layer of solid electrolyte of which is made of a double layer comprising a layer of a germanium and silicon alloy (GeSe) and a layer of tantalum pentoxide (Ta2O5). They more particularly noted that this enables a better confinement of the conductive bridges formed in such a double layer of solid electrolyte. It should be noted that, in this case, the conductive bridges are called CF, for «conductive filaments».

It should however be noted that, in both solutions, the resistance windows i.e. the resistance ratios noted between the conductive and non conductive states of the memory structures studies remain lows. Besides, it would be very advantageous to be able to increase the resistance in the non conductive state so as to reduce the leakage currents so as to drastically limit the consumption of the devices using these.

In another example of publication which is an application for a patent filed with the American office of patents, published on Jul. 5, 2012 with number US 2012/0168705 and entitled «Bipolar Switching Memory Cell With Built-in "On" State Rectifying Current-Voltage Characteristics» the inventors also describe a device of the resistive RAM type which has a particularity in that a diode in series with each cell is obtained through the selection of materials and the structure of the layers used. A non ohmic current-voltage (IV) behaviour, of the rectifying type, can then be noted when reading a memory cell. As a matter of fact, when a cell is in an "on" or conductive state, a conductive filament is present which has been formed in a layer of solid electrolyte from metal ions from one of the electrodes. The metal filament is then in contact with a thin insulating layer to form a metal-insulator-metal or MIM structure. A tunnel effect barrier is thus created, which makes it possible to obtain a rectifying behaviour IV of the Schottky diode type.

Figure 1:
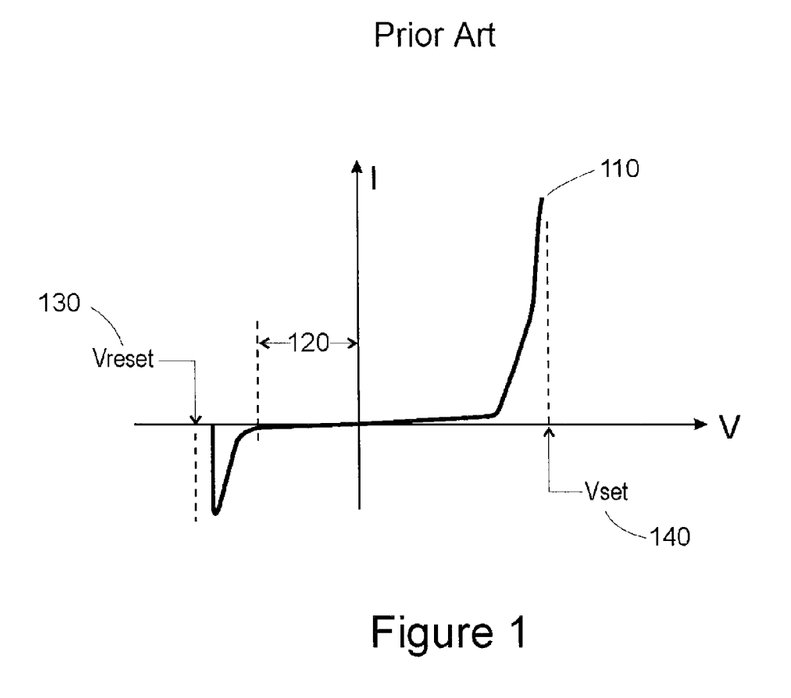
FIG. 1 shows the current-voltage (IV) behaviour of a resistive memory cell (ReRAM) of the prior art.

Although the decision of introducing a diode in series with the memory cell may be advantageous for some applications, it should be noted here that it generally is a significant drawback, specifically when it comes to reading the content of a resistive memory cell which has been programmed. As shown in FIG. 1, which is similar to FIG. 6 of the above-mentioned publication, the behaviour IV of a cell is then typically the one shown by curve 110. The presence of a diode results in that, in order to determine whether the device is conductive or not, and thus to determine what logic level is stored, a voltage which is at least slightly greater than the threshold voltage 120 of the diode should always be applied. With the unavoidable dispersions of the method of production, and the variations in the electric parameters resulting therefrom, relatively important currents and voltages may have to be developed by the reading circuits, so as to be able to undoubtedly determine which level has actually been stored. This does not participate in reducing the power consumption as desired for this kind of device.

It should be noted here that the discrimination by the reading circuit of the resistive levels stored may be all the more difficult since the ratios of resistances between the conductive resistive state, generally noted «$R_{ON}$», and the non conductive state, generally noted «$R_{OFF}$», may, as mentioned above, be relatively low according to the considered memory structures.

It would thus be particularly advantageous to provide a CBRAM compatible with the steps of production of said BEOL of a standard line of production of integrated circuits and which, at least partially enhances, the above mentioned advantageous characteristics of the memories of the RRAM type.

One objective of the present invention more particularly aims at providing a CBRAM structure having a non conductive state with a very high resistance so as to participate in reducing the leakage currents of the memory cells and the power consumption of the devices using these.

Another objective of the present invention is to enable the reading of the memory cells with of the low reading voltages so as to reduce the consumption of the device.

The present invention aims at reaching at least one of these objectives.

The other objects, characteristics and advantages of the present invention will be better understood when reading the following description and examining the appended drawings. Other advantages may of course be integrated therein.

SUMMARY OF THE INVENTION

According to one embodiment, the invention relates to a resistive memory cell comprising a first and a second metal electrodes and a solid electrolyte positioned between the first and the second metal electrodes, with the solid electrolyte comprising a commutation layer in contact with the first electrode and a dielectric layer. Said resistive memory cell is able to be electrically modified so as to switch from a first resistive state (HRS state) to a second resistive state (LRS state) wherein the resistance ($R_{ON}$) of the memory cell is at least ten times and preferably at least 100 times smaller than the resistance ($R_{OFF}$) of the memory cell in the HRS state, in the LRS state the first electrode being so arranged as to supply metal ions intended to form at least a conductive filament through said commutation layer in order to obtain the LRS state, with the first and second electrodes with the solid electrolyte then being able to form a metal-insulator-metal (MIM) structure made conductive when the filament is formed. The memory cell is so configured that the switching from the HRS state to the LRS state is carried out by applying a VSET voltage to the memory cell and the switching from the LRS state to the HRS state being carried out by applying a VRESET voltage to the memory cell. In the LRS state the memory cell is conductive for a range of voltages between 0 Volts and $$\frac{VRESET}{2}.$$

This solution gives the made conductive MIM structure a conductive current-voltage (IV) behaviour more particularly for low voltages corresponding to the reading voltages.

The memory cell according to the invention has a particularly high $R_{OFF}/R_{ON}$ ratio thus enabling an accurate and easy reading. Besides, the high value of $R_{OFF}$ makes it possible to significantly reduce the leakage currents. In addition, the value of $R_{ON}$ remains very low, which enables to use low reading voltages.

Optionally, the memory cell according to the invention comprises at least any one of the following characteristics separately or in combination.

- Advantageously and preferably, the dielectric layer is made of hafnium oxide (HfO2). It may however be made of another material such as silicon dioxide (SiO2), tantalum pentoxide (Ta2O5), zirconium oxide ZrO2, silicon nitride (Si3N4).
- The difference between the value of the work function of the metal material composing the first electrode and the value of work function of the metal material composing the second electrode does not exceed 0.5 electronvolts (eV) and preferably 0.25 electronvolts (eV), with the metal materials composing the first and second electrodes being different.
- In the LRS state, the memory cell has, in said range of voltages, an ohmic or quasi-ohmic current-voltage (IV) behaviour, with the resistance of the memory cell in the LRS state not varying by more than 5% in said range of voltages.
- In the LRS state, the memory cell has, in said range of voltages, a resistance (RON) of less than 80 kilo ohms; preferably less than 50 kilo ohms; preferably less than 10 kilo ohms; preferably comprised between 2 and 10 kilo ohms.
- The second electrode is in contact with the dielectric layer.
- The commutation layer is in contact with the dielectric layer.
- The first electrode is in contact with the commutation layer.
- The first electrode is in contact with the commutation layer, the commutation layer is in contact with the dielectric layer and the second electrode is in contact with the dielectric layer.
- The first electrode is made of a metal material selected among: silver (Ag) and copper (Cu).
- The second electrode is made of a metal material selected among: tungsten (W), tantalum (Ta).
- The commutation layer is made of a material selected among: a chalcogenide and an oxide of a transitional metal.

The commutation layer is made of germanium disulphide (GeS2).

The dielectric layer made of hafnium oxide (HfO2) has a thickness between nanometer and 8 nanometers and preferably between 2 and 6 nanometers. Particularly advantageously and surprisingly, this makes it possible to obtain a very high value for $R_{OFF}$ without reducing the $R_{OFF}/R_{ON}$ ratio.

The commutation layer has a thickness between 20 and 150 nanometers.

The VSET voltage is positive and the $V_{RESET}$ voltage is negative.

The cell is so configured that no filament is created in the LRS state.

According to one embodiment, the invention relates to a microelectronic device comprising a memory cell array according to the invention.

According to one embodiment, the invention relates to a method for programming a resistive non volatile memory cell array according to the invention. Said memory cell are initially in a first resistive state (original HRS) and the solid electrolyte is able to be electrically modified so as to switch the memory cell from the original HRS state to a second resistive state (LRS) wherein the resistance of the memory cell is less than the resistance of the memory cell in the original HRS state. The method comprises the following steps:

programming the array by electrically switching a plurality of memory cells from the original HRS state to the LRS state;

leaving the other memory cells in their original HRS state when reading the memory cells array.

The memory cell has an original resistive state (original HRS) at the end of the method of production of the cell and before any step of programming the cells. The original resistive state is thus used as a functional resistive state. The device thus comprises reading circuits so configured as to detect a difference of resistance between the original resistive state (original HRS) and said second resistive state (LRS). The resistance of the cells in the original HRS state is at least ten times and preferably at least one hundred times greater than the resistance of the cells in the LRS state.

Optionally, the method according to the invention comprises at least any one of the following steps or characteristics taken separately or in combination.

Electrically switching a memory cell from the original HRS state to the LRS state comprises the following step: applying to the cell of the array high enough voltage to switch the memory cell from the original HRS state to said LRS state.

The method comprises the following steps for electrically switching at least a memory cell from the original resistive HRS state to a programmed resistive state HRS wherein the resistance (programmed $R_{OFF}$) of the memory cell has a resistance lower than the resistance (original $R_{OFF}$) of the cell in the original HRS state and has a resistance greater than the resistance ($R_{ON}$) of the cell in the LRS state:

applying a positive VSET voltage to the memory cell so as to switch the memory cell from the original HRS state to the LRS state;

applying a negative VRESET voltage to the cell so as to switch the memory cell from the LRS state to said programmed HRS state.

According to another embodiment, the invention relates to a resistive non volatile memory cell comprising a first and a second metal electrodes and a solid electrolyte positioned between the first and the second metal electrodes, with the solid electrolyte comprising a commutation layer in contact with the first electrode and a dielectric layer, the first electrode being so arranged as to supply metal ions intended to make conductive said commutation layer, with the first and second electrodes with the solid electrolyte forming a metal-insulator-metal (MIM) structure made conductive when said commutation layer has been made conductive, the cell being characterised in that the metal materials composing the two electrodes are so selected as to obtain a conductive current-voltage (IV) behaviour of the MIM structure made conductive.

Advantageously, the difference between the value of the work function of the metal material composing the first electrode and the value of the work function of the metal material composing the second electrode does not exceed 0.5 electronvolts (eV) and preferably does not exceed 0.25 electronvolts (eV).

According to another embodiment, the invention relates to a resistive memory cell comprising two metal electrodes located on either side of a solid electrolyte including a commutation layer and a dielectric layer. That of the two electrodes which is in contact with the commutation layer is called an active one and is used to supply metal ions intended to form a conductive filament through said commutation layer, a structure wherein that of the two electrodes in contact with the dielectric layer is called an inert one and enables to form a conductive metal-insulator-metal (MIM) structure after forming the filament. Preferably, the metal materials composing the two electrodes are so selected as to obtain a conductive current-voltage (IV) behaviour of the conductive MIM structure. Preferably, the metal materials composing the two electrodes are so selected as to obtain an ohmic current-voltage (IV) behaviour of the conductive MIM structure.

BRIEF DESCRIPTION OF THE FIGURES

The goals, objects, and the characteristics and advantages of the invention will be better understood when reading the detailed description of one embodiment of the latter, which is illustrated by the following appended drawings wherein.

The appended drawings are given as examples and do not intend to restrict the invention. They are schematic principle illustrations intended to facilitate understanding the invention and do not necessarily comply with the scale of the practical applications. In particular, the relative thicknesses of the different layers and films are not representative of reality.

DETAILED DESCRIPTION OF THE INVENTION

It should be noted that, in the scope of the present invention, the words «on», «overlying» or «underlying» or the equivalent thereof do not necessarily mean «in contact with». Thus, for example, the deposition of a first layer onto a second layer, does not necessarily mean that the two layers are directly in contact with each other, but this means that the first layer at least partially covers the second layer while being either directly in contact therewith, or separated therefrom by another layer or another element.

Figure 2:
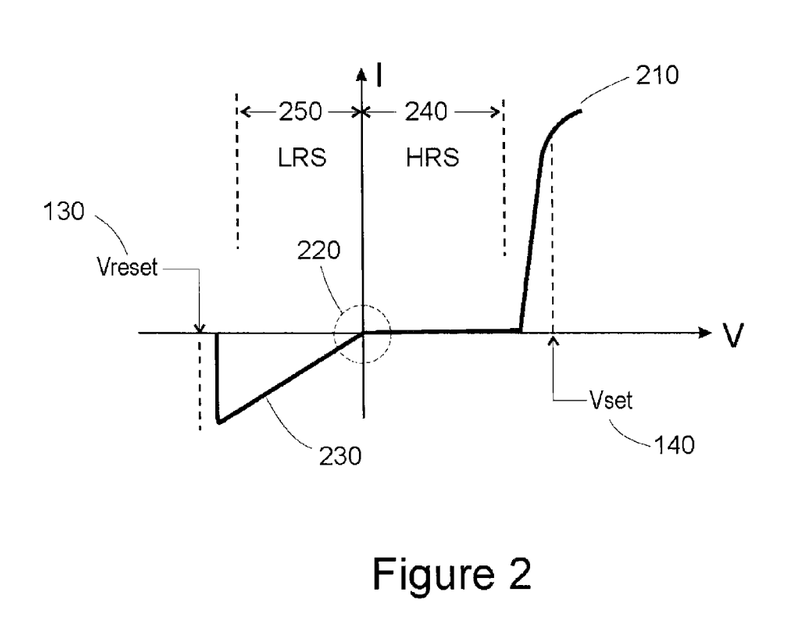
FIG. 2 shows the current-voltage behaviour of a ReRAM cell according to the invention.

As will be explained in greater details hereunder, the invention specifically relates to obtaining a conductive behaviour IV which will make it possible to determine, with low or even very low reading voltages, the content which has been programmed. Besides, such reading will be facilitated by the simultaneous obtaining of a large window of resistances, i.e. a high, or even a very high, ratio between the $R_{ON}$ and $R_{OFF}$ resistances. FIG. 2, which must be compared to FIG. 1, illustrates this very advantageous behaviour of a memory cell according to the invention. The behaviour IV of a cell is then typically the one shown by the curve 210. The content memory can be read in a low voltage 220 zone wherein the resistive behaviour is conductive 230 with low $R_{ON}$ values when a SET operation has been executed in the memory cell.

Additionally, FIGS. 1 and 2 also show that voltages having opposite polarities exist which, when they are applied, make it possible to place in writing mode a cell in the non conductive state or in the conductive state. These are, respectively, the so-called «RESET» 130 and «SET» 140 voltages which are, necessarily, higher than the voltages applied 220 for reading and which must not, of course, affect the memory content which can be all the more easily obtained since the reading voltage may be low.

Figure 3A:
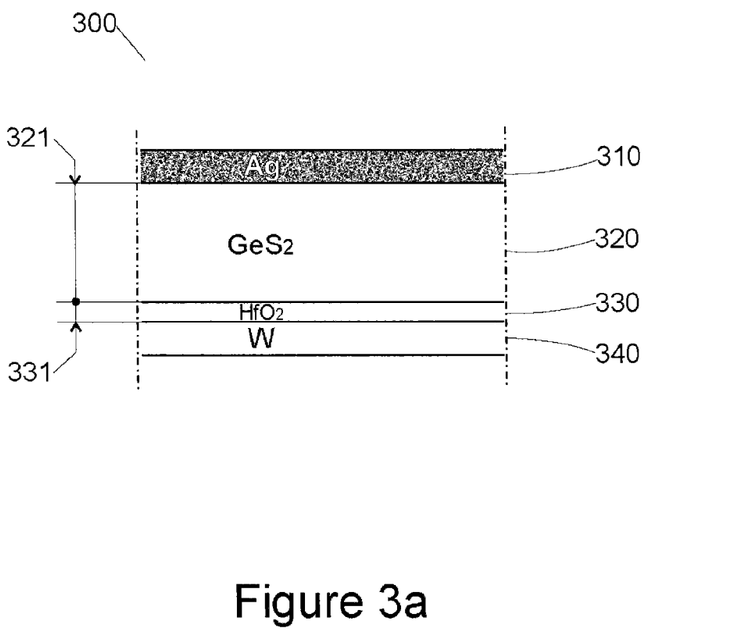
FIGS. 3a and 3b illustrate the layered structure of a ReRAM cell according to the invention comprising a solid electrolyte including a thin insulating layer.
Figure 3B:
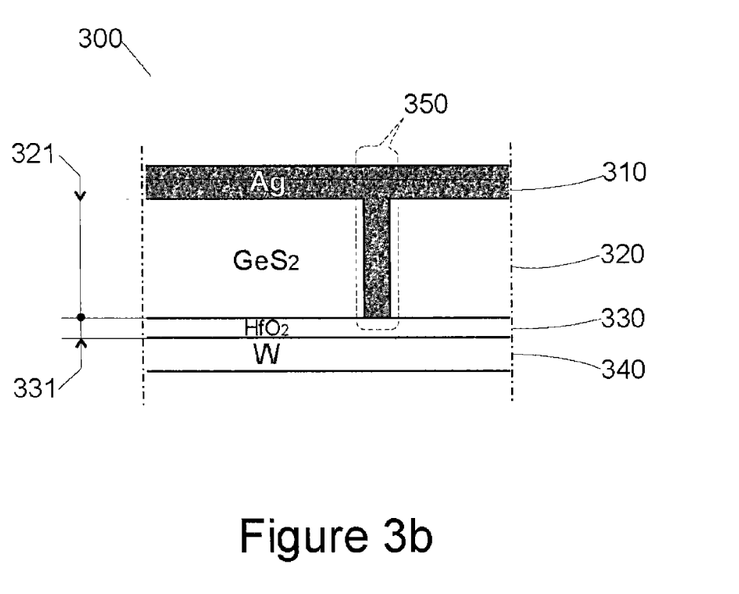

To obtain the behaviour illustrated in FIG. 2, the invention uses the structure of FIGS. 3a and 3b. As seen above, one object of the invention consists in reducing the leakage currents in the non conductive state and thus increase the state to a high resistance, which is generally called HRS, the acronym for «high resistance state» in order to obtain as high as possible a $R_{OFF}$ value (the $R_{OFF}$ resistance corresponds to the resistance of the cell in the HRS state). This must be obtained without having to increase the operation voltages which must specifically remain compatible with the CMOS technology generally used to implement the associated logic functions.

For this purpose, the structure 300 of a memory device according to the invention comprises a solid electrolyte bilayer: 320 and 330. The layer 320 constitutes the resistive commutation layer. It is directly in contact with the upper metal electrode 310. The upper electrode, in the exemplary representation of FIG. 3a, is called the «active» electrode since it is the source of metal ions which make it possible to form a conductive filament in the commutation layer 320. The dielectric layer 330 is intended if not to eliminate, at least to significantly reduce the leakage currents which would otherwise be established with the lower electrode 340 which is, contrary to the preceding one, an «inert» electrode of the device, i.e. the one which is not intended to supply the metal ions.

The operation principle of a CBRAM lies on the reversible formation of a conductive filament (CF) 350 from the metal ions, for example silver (Ag+) or copper (Cu+), generated by the material composing the upper electrode 310, the so-called active one. The filament is formed, through the solid electrolyte which the so-called commutation layer 320 is made of. The solid electrolyte is typically chalcogenide or an oxide of a transitional metal. For example germanium disulphide (GeS2) is used for the commutation layer. The lower metal electrode 340, the so-called inert one, is typically made of tungsten (W) or tantalum (Ta).

The switching from the low resistance state 250 or LRS, the acronym for «low resistance state» (the corresponding $R_{ON}$ resistance is the resistance of the cell in the LRS state), to the high resistance state 240 or HRS, and reciprocally, and as shown in FIGS. 1 and 2, uses so-called SET and RESET operations. During a SET operation, a positive voltage 140 is applied onto the active electrode 310, also called the «anode», which oxidises and generates the silver or copper (Ag+, Cu+) ions according to the material the electrode is made of. The ions migrate to the inert electrode 340, also called the «cathode», where they are reduced. They generate, in the solid electrolyte, a nucleation process, which leads to the forming of a conductive filament rich, for example in silver or copper, which switches the device to the LRS state. When the polarity of the voltage applied 130 to the terminals of the electrodes of the device is reversed, during a RESET operation, the conductive filament 350 is in turn oxidised and generates the ions until the latter is dissolved, which switches back the device to the HRS state.

A memory cell according to the invention is thus more particularly made of two layers of a solid electrolyte: one 320, so-called the commutation layer, is typically made of germanium disulphide (GeS2) having a thickness 321 between 20 and 150 nanometers (or nm, $10^{-9}$ meter); the other one 330, prevents leakage currents from forming, which would otherwise occur through the commutation layer. It is advantageously made of hafnium oxide (HfO2) having a thickness 331 between 1 and 5 nm. This layer is typically deposited using a so-called ALD method, the acronym for «atomic layer deposition» wherein layers having a monatomic thickness are successively deposited.

As mentioned above, the layer 330 made of HfO2 and optionally of other materials such as silicon dioxide (SiO2), tantalum pentoxide (Ta2O5), zirconium oxide (ZrO2), silicon nitride (Si3N4), makes it possible to increase the $R_{OFF}/R_{ON}$ ratio, i.e. the window of resistances between the conductive and non conductive states, without degrading the programming voltages so that these remain compatible with the technology used for the logic circuits associated, for example, with the CMOS technology.

As regards the operation of a device according to the invention, it should be noted that the Ag+ or Cu+ ions require only low energies to establish the connections with the atoms of the material composing the commutation layer 320, i.e. with a chalcogenide or an oxide of a transitional metal. A conductive filament 350, for example rich in silver, is thus easily generated through the commutation layer made, for example, of GeS2, provided that high enough a voltage is applied to the upper electrode 310. On the contrary, high energies are required to establish the connections between the silver atoms and those of a material having a high permittivity such as HfO2 which for example the layer 330 is made of. Consequently, there is no dissolution of the silver atoms through this layer, which participates in a stable formation of the conductive filament.

As already mentioned above, the operating principle of the structure of the layers 300 forming a memory cell according to the invention lies on the reversible forming of a conductive filament (CF) 350 from the metal ions, for example Ag+, which diffuse through a solid electrolyte 320, for example of GeS2, whereas there is no diffusion of these ions through the underlying layer 330 made, for example, of HfO2 or of one of the other materials mentioned above.

In the LRS state the upper metal electrode 310, through the conductive filament, then comes in contact with the thin insulating layer 330 to form, with the lower electrode 340, a sandwich of layers of the metal-insulator-metal (MIM) type which has the characteristics of a tunnel effect barrier to which is normally conductive in the conditions of utilisation of the device.

It should be noted here that it is important for the selection of the metal materials of the upper and lower electrodes to be such that they will not have, in the above MIM structure, a rectifying effect, so that the obtained behaviour is the one described in FIG. 2. To obtain this result for the metal materials of the upper and lower electrodes a so-called "work function" characteristic, having very close values may be selected. As is known, the work function (for a metal) or the electron affinity (for an insulator) is the quantity of energy released further to the capture of an electron. The work function (metal) is the minimum energy, measured in electron-volts, required for removing an electron from the Fermi level of a metal up to a point located at the infinite outside the metal (vacuum level).

For example, the silver or copper (Ag, Cu) couple, on the one hand, and tungsten (W) on the other hand, which, respectively, have a work function of 4.7 electronvolts (eV) and of 4.5 eV, are compatible. Each metal of the selected couple must not have a work function different by more than 0.35 eV and preferably by more than 0.25 eV from the other one. The materials for the two electrodes must however be different, and one of the electrodes has to be inert.

It should be noted here that all the couples of materials disclosed by the publication US 2012/0168705, cited in the preamble of the description, cannot all claim the forming of a diode, against the disclosure in this publication. The selection of the materials as provided by the present invention, and more particularly the selection of the materials of the couple of electrodes, specifically aims at avoiding forming a diode and a rectifying effect which would be prejudicial to the applications considered by the invention. More particularly, the publication US 2012/0168705 provides structures wherein, in the LRS state the memory cell is not conductive for a range of voltages between 0 Volts and VRESET. This selection of materials is possible, based on the work function of the materials considered, as mentioned above. The development of the present invention thus required to go against the teachings of the publication US 2012/0168705.

More generally, the properties of the stack must be so adjusted that the resistance of the MIM capacity is of the order of the target $R_{ON}$ resistance of the memory in the LRS state. Typically, such $R_{ON}$ resistance is lower than 80 kOhms. Preferably, it ranges from 2 to 10 kOhm, which is of the order of magnitude of the resistances aimed at in the state switching from a memory according to the state of the art without an intermediary dielectric layer. Such $R_{ON}$ resistance is controlled by the MIM stack, by setting, in particular, the following parameters:
  (1) The insulating layer 330. More particularly, a value between 2 and 10 eV and preferably of approximately 4 or 5 eV is selected for the level of bandgap thereof; a thickness between 1 and 8 nm and preferably between 1 and 3 nm; an electron affinity between 1 and 10 eV and preferably of approximately 2 eV. It should be reminded that the level of the bandgap usually referred to as the gap or bandgap is the difference between the energy of the conduction band and the energy of the valence band.
  (2) The materials of the second electrode 340 and of the insulating layer 330. Preferably, it is selected so that the difference between the work function of the conductive material 340 and the electron affinity of the insulating material 330 is between 2-10 eV and preferably between 2 and 3 eV.
  (3) The materials of the first metal electrode 310 and of the second metal electrode 340. Preferably, and as mentioned above, it is selected so that the difference between the work function of such materials is smaller than 500 meV and preferably smaller than 250 meV. i.e.

For example a HfO2 layer 2 nm thick gives a resistance of ~5 kOhm when this layer is in a Ag/HfO2/W structure, which confers to the MIM structure a conductive behaviour when a SET operation is executed on the latter.

In the LRS state the memory cell is thus conductive for a range of voltages between 0 Volts and $$\frac{VRESET}{2}.$$

This range comprises the negative voltages from 0 Volts to $$\frac{VRESET}{2}.$$

This conductive behaviour even extends beyond $$\frac{VRESET}{2}$$

and typically up to 0.8 VRESET and even almost up to VRESET as clearly shown in FIG. 2.

In the HRS state the metal of the upper electrode 310 is separated from the insulating material forming the layer 330 by the material of the commutation layer 320 which is, for example, GeS2, a material having the properties of a semiconductor.

It has been noted that the programming condition, i.e. the conditions for forming a conductive filament 350 and of the dissolution thereof, are mainly determined by the thickness 321 of the GeS2 layer 320, whereas they are practically independent of I the thickness 331 of the layer 330 made, for example of HfO2.

FIGS. 4a to 4d show the results of simulation of the memory structure 300 according to the invention.

Figure 4A:
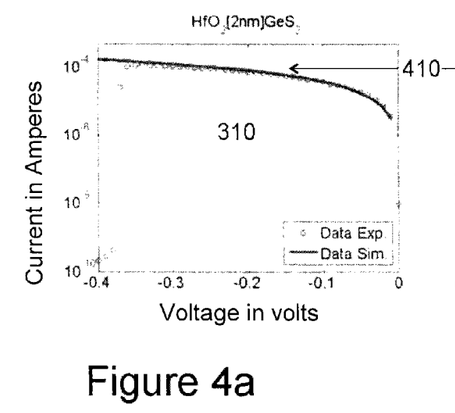
FIGS. 4a to 4d show the values of current obtained in the conductive and non conductive states for two different thicknesses of the insulating layer of the solid electrolyte.
Figure 4B:
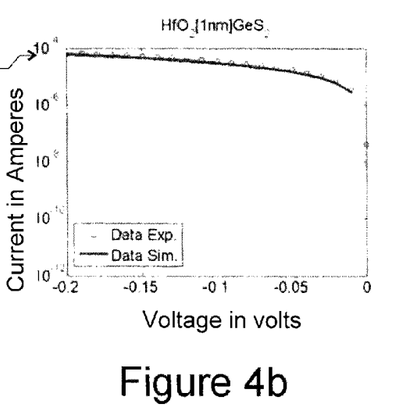

The simulation relates to the sandwich of layers and of materials illustrated in FIGS. 3a and 3b, i.e. Ag, GeS2, HfO2 and W for, respectively, the layers 310, 320, 330 and 340. The experiment was carried out with two thicknesses 331 of HfO2 insulating layers: one, 2 nm thick, corresponding to FIGS. 4a and 4c; the other one, 1 nm in thickness corresponding to FIGS. 4b and 4d. FIGS. 4a and 4b give the values of current measured in the conductive state ($R_{ON}$) and FIGS. 4c and 4d the values measured in the non conductive state ($R_{OFF}$).

It should be noted that the current in the conductive state is of the order of a few tenths of millampere (mA) 410 for the two thicknesses of the HfO2 layer (2 and 1 nm). No significant difference can thus be noted in the value $R_{ON}$ according to the thickness 331 of the layer 330.

Figure 4C:
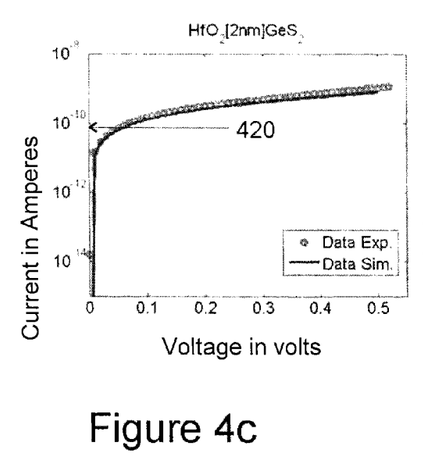
Figure 4D:
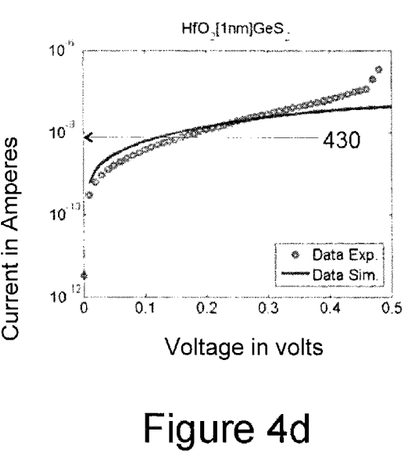

In the non conductive state, a high influence of the thickness of the HfO2 layer can be noted, on the contrary. As a matter of fact, it can be noted that the current in the non conductive state is weaker ($10^{-10}$) 420 by two orders of magnitude when the HfO2 layer is 2 nm thick with respect to the current corresponding to the 1 nm ($10^{-8}$) layer 430. The value $R_{OFF}$ thus strongly depends on the thickness 331. An increase in the thickness of the dielectric layer thus makes it possible to strongly increase $R_{OFF}$ without degrading the $R_{OFF}/R_{ON}$ ratio. A thickness between 1 and 8 nm and preferably between 2 and 6 nm makes it possible to reach a good compromise, and an excessive thickness would be prejudicial since it would lead to an increase in the value of resistance $R_{ON}$ of the LRS state beyond the target value. As a matter of fact, it could be noted that the insulating layer 330 controls the value of $R_{ON}$.

When the memory is in the resistive state, the impact of the HfO2 layer on the conduction is amplified, and results in an increase in the value of the resistance of the memory in the insulating state $R_{OFF}$. As a matter of fact, when the memory is in the insulating state:

The presence of the GeS2 layer without conductive filament reduces the concentration of electrons as compared to the interface of the HfO2layer, thus reducing the current passing through the GeS2/HfO2 stack. In the conductive case, the silver filament in contact with the HfO2 layer makes it possible to increase such concentration of carriers and thus the current in the conductive state.

The presence of the GeS2 layer without conductive filament reduces the electric field in the HfO2layer, since the difference in the potential at the GeS2/HfO2 stack terminals is distributed over each one of such two layers, according to the respective values of GeS2 and HfO2 dielectric constants. Consequently, the GeS2 layer reduces the current through the HfO2layer. In the conductive case, the whole electric field during the reading phase is reported in the HfO2 layer since no potential drop occurs at the terminals of the conductive silver filament. This increases the current and thus reduces the value of the resistance.

Figure 5A:
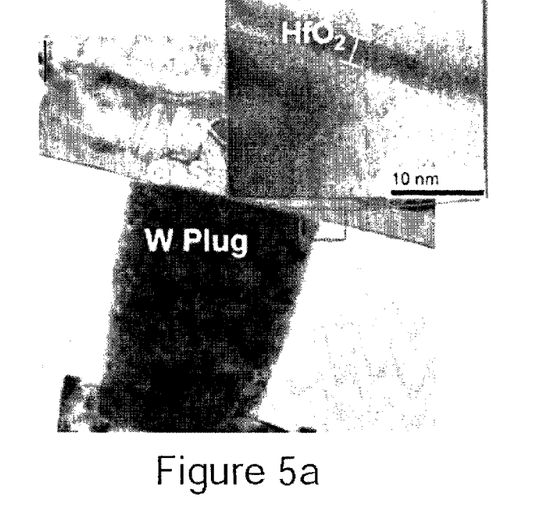
FIGS. 5a to 5c show experimental results obtained with the devices according to the invention.
Figures 5B, 5C:
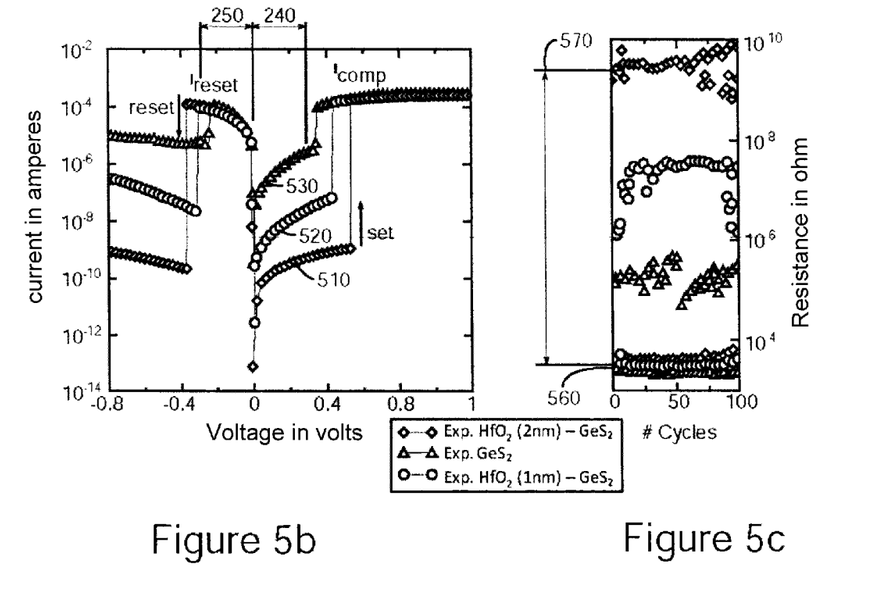

FIGS. 5a to 5c show the experimental results of resistive memory cells according to the invention.

FIG. 5a is a picture taken with a system of transmission electron microscopy (TEM) which shows a device according to the invention produced with the materials shown in the FIGS. 3a and 3b.

FIG. 5b is a diagram showing the current voltage (IV) characteristics of the following structures:

The curve 510 corresponds to the case of a HfO2 layer having a thickness of 2 nm, i.e. to the Ag/GeS2/HfO2(2 nm)/W structure.

The curve 520 corresponds to the case of a HfO2 layer having a thickness of 1 nm, i.e. to the Ag/GeS2/HfO2(1 nm)/W structure.

The curve 530 is a curve drawn for comparison with a device comprising no HfO2 layer, i.e. corresponding to the Ag/GeS2/W structure.

The strong influence of the presence or the absence of the HfO2 layer and the thickness thereof on the current in the HRS state 240 of the device and, on the contrary, the absence of remarkable change in the resistance in the LRS state 250 can be noted once again.

It should be noted here that the current scale on the Y axis is logarithmic and the currents are expressed in absolute value, which should be taken into account when comparing with FIG. 2.

FIG. 5c shows the evolution of the resistances $R_{ON}$ and $R_{OFF}$ according to the number of programming cycles. As already noted above, the presence or the absence of the HfO2 layer and of the thickness thereof only slightly affects or even does not affect the value $R_{ON}$ 560 which is always of less than $10^4$ Ohms. A significant influence of the HfO2 layer can be noted, though, on the $R_{OFF}$ resistances. The presence of this layer, with a thickness of 2 nm, makes it possible to obtain a $R_{OFF}/R_{ON}$ ratio 570 of approximately 106.

The ReRAM devices according to the invention can thus be very advantageously used in numerous applications wherein the leakage currents and/or the consumption, have to be strictly controlled, such as for example in the so-called embedded systems. The high resistance $R_{OFF}$ obtained as well as the conductive behaviour (230) $R_{ON}$ when the device is conductive enable a low voltage measurement of the content of the memory cell according to the invention, which participates in reducing the consumption of the devices using these.

The applications of the invention more particularly relate to the user-programmable gate arrays of the FPGA type which are widely used for designing the systems and developing prototypes because they can be reconfigured after production. The FPGA are very flexible and offer low development risks, short marketing times and reasonable costs for small volumes of production.

The FPGA are typically provided as an array of logic blocks comprising commutation blocks and connexion blocks which make it possible to specifically interconnect the logic blocks for a given application. The assembly is programmable and the configuration is memorised in memories associated with the various blocks.

The non volatility of the resistive memories is a important asset, since it is no longer necessary to load the configuration upon each voltage application. Additionally, the memory elements of a FPGA can then be typically of the 1T-2R type, i.e. these simply consist of a transistor and two programmable resistances forming a dividing bridge which may be in two states. When maintaining one or the other of the resistances in the HRS state, as the $R_{OFF}$ value of a resistive memory cell according to the invention is high, even very high, very weak leakage currents and a low consumption are provided in the utilisation conditions.

The resistive state as obtained upon completion of the production of the memory cell and prior to any application of a voltage to the memory cell aiming at modifying the resistance thereof is called an original resistive state (original HRS) or «pristine».

This resistive original HRS state has a particularly high original resistance $R_{OFF}$. It can be noted that this $R_{OFF}$ original resistance is even higher than the resistance of the resistive state (programmed HRS) obtained after forming a filament and after eliminating this filament. This resistive state obtained after forming a filament and after eliminating this filament can be called a highly resistive programmed state (programmed HRS). It has a $R_{OFF}$ programmed resistance. Typically:

original $R_{OFF}$>$10^2$ programmed $R_{OFF}$ and
original $R_{OFF}$>$10^7$ $R_{ON}$.

The invention provides for an advantageous programming mode wherein the original HRS state is used in the functional mode. The array of memory cells is thus programmed by switching a selection of cells from the original HRS state to the LRS state. The other cells are kept in the original HRS state, specifically during the phases of reading. The reading circuits associated with the array will easily identify whether the resistance of the cell is in the LRS state or in the original HRS state. This programming mode is very advantageous when applied to the FPGA for example. Besides, the original HRS state reveals very stable over time, during the reading cycles and when submitted to a relatively high temperature.

To summarise, the invention provides for a new resistive RAM cell which makes it possible to significantly increase the $R_{OFF}/R_{ON}$ ratio without degrading the programming conditions so that they remain compatible with the standard CMOS technology more specifically for the FPGA applications.

The invention is not limited to the embodiments described above, but extends to all the embodiments within the scope of the claims.

The invention claimed is:

1. A resistive memory cell, comprising:
    a first metal electrode and a second metal electrode, materials composing the first metal electrode and the second metal electrode being different; and
    a solid electrolyte disposed between the first and the second metal electrodes, the solid electrolyte comprising a commutation layer and a dielectric layer,
        the commutation layer being germanium disulphide ($GeS_2$), having a thickness of greater than or equal to 20 nm and less than or equal to 150 nm, and being in contact with the first metal electrode and the dielectric layer,
        the dielectric layer having a thickness of greater than or equal to 1 nm and less than or equal to 8 nm, and being in contact with the second metal electrode and the commutation layer, and
        the dielectric layer being a material selected from among hafnium oxide ($HfO_2$), tantalum pentoxide ($Ta_2O_5$), zirconium oxide ($ZrO_2$), and silicon nitride ($Si_3N_4$),
    wherein the resistive memory cell is configured to reversibly switch between a pre-programmed state and a functional state by a programming current of about 10 µA to about 100 µA and without having a rectifying effect, the solid electrolyte being configured to be electrically modified to switch the resistive memory cell from the pre-programmed state to the functional state such that a resistance of the resistive memory cell in the functional state is at least ten times smaller than a resistance of the resistive memory cell in the pre-programmed state,
    wherein, when the resistive memory cell is in the functional state, the first metal electrode is configured to supply metal ions to the solid electrolyte, and the commutation layer comprises at least one conductive filament therethrough, the at least one conductive filament electrically connecting the first and the second metal electrodes in a metal-insulator-metal (MIM) structure through the dielectric layer,
    wherein, when a set voltage (VSET) is applied, the resistive memory cell is configured to switch from the pre-programmed state to the functional state,
    wherein, when a reset voltage (VRESET) is applied, the resistive memory cell is configured to switch from the functional state to the pre-programmed state,
    wherein, when the resistive memory cell is in the functional state, the resistive memory cell is conductive for a range of voltages between 0 V and $$\frac{VRESET}{2},$$

and
    wherein a difference between a work function value of a first metal material of the first electrode and a work function value of a second metal material of the second electrode does not exceed 0.5 eV.

2. The resistive memory cell according to claim 1, wherein, in said range of voltages, the resistive memory cell in the functional state has an ohmic or quasi-ohmic current-voltage behaviour, a resistance of the resistive memory cell not varying by more than 5% in said range of voltages.

3. The resistive memory cell according to claim 1, wherein, in said range of voltages, the resistance of the resistive memory cell in the functional state is less than 80 kilo-ohms and more than about 2 kilo-ohms.

4. The resistive memory cell according to claim 1, wherein the first electrode is made of a metal material selected from among silver (Ag) and copper (Cu).

5. The resistive memory cell according to claim 1, wherein the second electrode is made of a metal material selected from among tungsten (W) and tantalum (Ta).

6. The resistive memory cell according to claim 1, wherein the commutation layer is made of a material selected from among a chalcogenide and an oxide of a transitional metal.

7. The resistive memory cell according to claim 1, wherein the dielectric layer has a thickness of more than or equal to 2 nm and less than or equal to 8 nm.

8. The resistive memory cell according to claim 1, wherein the dielectric layer and has a thickness between 2 nm and 6 nm.

9. The resistive memory cell according to claim 1, wherein the set voltage is positive and the reset voltage is negative.

10. The resistive memory cell according to claim 1, wherein the first electrode is in contact with the commutation layer, the commutation layer is in contact with the dielectric layer, and the second electrode is in contact with the dielectric layer.

11. A microelectronic device comprising a memory cell array of resistive memory cells according to claim 1.

12. A method for programming a memory cell array of resistive memory cells according to claim 1, each resistive memory cell in the array being initially in the pre-programmed state, the method comprising:
    programming the memory cell array by electrically switching a plurality of the resistive memory cells from the pre-programmed state to the functional state by the programming current of about 100 µA and without producing a rectifying effect; and
    retaining, in the pre-programmed state, other resistive memory cells of the plurality of resistive memory cells during a reading operation of the memory cell array.

13. The method according to claim 12, wherein a cell resistance in the pre-programmed state is at least ten times greater than a cell resistance in the functional state.

14. The method according to claim 12, the electrically switching further comprising:
    applying a positive set voltage to at least one resistive memory cell to electrically switch the at least one resistive memory cell from the pre-programmed state to the functional state; and applying a negative reset voltage to the at least one resistive memory cell to electrically switch said cell from the functional state back to a programmed resistance in the first resistive state, wherein the programmed resistance of the at least one resistive memory cell after switching from the functional state back to the first resistive state is less than a resistance of the at least one resistive memory cell in the pre-programmed state, and is greater than a resistance of the at least one resistive memory cell in the functional state.

15. A resistive memory cell, comprising:
a first metal electrode and a second metal electrode; and
a solid electrolyte disposed between the first and the second metal electrodes, the solid electrolyte comprising a commutation layer and a dielectric layer,
   the commutation layer being germanium disulphide ($GeS_2$), having a thickness of greater than or equal to 20 nm and less than or equal to 150 nm, and being in contact with the first metal electrode and the dielectric layer,
   the dielectric layer having a thickness of greater than or equal to 1 nm and less than or equal to 8 nm, and being in contact with the second metal electrode and the commutation layer, and
   the dielectric layer being a material selected from among hafnium oxide ($HfO_2$), tantalum pentoxide ($Ta_2O_5$), zirconium oxide ($ZrO_2$), and silicon nitride ($Si_3N_4$),
wherein the resistive memory cell is configured to reversibly switch between a pre-programmed state and a functional state by a programming current of about 10 µA to about 100 µA and without having a rectifying effect, the solid electrolyte being configured to be electrically modified to switch the resistive memory cell from the pre-programmed state to the functional state such that a resistance of the resistive memory cell in the functional state is at least ten times smaller than a resistance of the resistive memory cell in the pre-programmed state, wherein, when the resistive memory cell is in the functional state, the first metal electrode is configured to supply metal ions to the solid electrolyte, and at least a part of the commutation layer is electrically conductive, the part of the commutation layer electrically connecting the first and the second metal electrodes in a metal-insulator-metal (MIM) structure through the dielectric layer, wherein, when a set voltage (VSET) is applied, the resistive memory cell is configured to switch from the pre-programmed state to the functional state, wherein, when a reset voltage (VRESET) is applied, the resistive memory cell is configured to switch from the functional state to the pre-programmed state, and wherein, when the resistive memory cell is in the functional state, the resistive memory cell is conductive for a range of voltages between 0 V and $$\frac{VRESET}{2}.$$

16. The resistive memory cell according to claim 15,
wherein materials composing the first metal electrode and the second metal electrode being different, and
wherein a difference between a work function value of a first metal material of the first electrode and a work function value of a second metal material of the second electrode does not exceed 0.5 eV.

17. The resistive memory cell according to claim 16, wherein said difference does not exceed 0.25 eV.

* * * * *